United States Patent [19]

Fuqua

[11] Patent Number: 5,072,330
[45] Date of Patent: Dec. 10, 1991

[54] DISPLAY DEVICE WITH BATTERY COVER HAVING AN INTEGRAL STAND

[75] Inventor: Jerry W. Fuqua, Corinth, Mich.

[73] Assignee: International Telecommunication Corp., Memphis, Tenn.

[21] Appl. No.: 631,087

[22] Filed: Dec. 19, 1990

[51] Int. Cl.$^5$ .................. H05K 5/03; H01M 2/10
[52] U.S. Cl. ..................... 361/394; 220/346; 248/688; 429/97; 368/309; 368/316; 368/317; 368/204; 361/392
[58] Field of Search .............. 220/345, 346, 347; 248/126, 455, 688; 429/9, 97; 368/309, 312, 316, 317, 203, 204; 361/380, 392, 293, 394, 395, 399; 455/347

[56] References Cited

U.S. PATENT DOCUMENTS

| | | | |
|---|---|---|---|
| 1,432,97 | 10/1922 | Rhoads | 429/97 X |
| 1,432,348 | 10/1922 | Lyhne | 429/97 X |
| 2,590,804 | 3/1952 | Vitale | 429/97 |
| 4,118,922 | 10/1978 | Ichiyananagi | 368/316 |
| 4,416,550 | 11/1983 | Wolber et al. | 368/316 X |
| 4,819,829 | 4/1989 | Rosten et al. | 220/346 |
| 4,880,712 | 11/1989 | Gordecki | 429/97 |
| 4,991,225 | 2/1991 | Holcomb et al. | 455/347 X |

Primary Examiner—Leo P. Picard
Assistant Examiner—Michael W. Phillips
Attorney, Agent, or Firm—Peter C. Van Der Sluys

[57] ABSTRACT

An integral battery cover and adjustable stand for securing a battery and for providing a stand for a battery-powered display device comprises stand legs which, in one configuration, provide a stand such that the display device has a viewing angle of approximately 45 degrees with respect to the desk top surface. The battery cover/stand further comprises retaining ribs which cooperate with corresponding retaining grooves in the display device. The retaining ribs and grooves allow the battery cover/stand to be easily adaptable to one of three variations, each allowing the display device to have a different viewing angle.

11 Claims, 4 Drawing Sheets

DISPLAY DEVICE WITH BATTERY COVER HAVING AN INTEGRAL STAND

BACKGROUND OF THE INVENTION

1. Field of the Invention

The present invention relates generally to desk and wall mountable display devices and more particularly to an integral battery cover/adjustable stand for use with a display device.

2. Description of the Prior Art

Display devices, such as digital clocks, are designed such that the display face can be easily seen by an intended viewer. Such display devices, if they are desk or table mounted devices, utilize a stand which supports the device so that the display face is positioned at a viewing angle so that it may be seen by the viewer. Generally, the display face is positioned so that it is perpendicular to the desk or table surface thereby having a viewing angle which is parallel to the desk or table surface. This viewing angle is normally not adjustable. This creates a problem in that the viewer may not adjust the viewing angle for optimum positioning with respect to where display device is located, i.e., on a tall shelf, on a desk, etc.

In addition, the viewer may want to mount the display device to a nearby wall. Most display devices do not have an adjustable desk stand in addition to a wall mount.

Furthermore, many electronic display devices, such as quartz clocks, require batteries for power. Naturally, these devices require a cover which functions to hold the battery in place and to prevent dust and other airborne particles from contaminating the device circuitry. One of the drawbacks of the traditional display device which requires batteries is that two separate components, a battery cover and a stand, must be manufactured for each display device. This adds to the cost and the complexity of the manufacture and assembly.

SUMMARY OF THE INVENTION

The present invention is designed to overcome the limitations that are attendant upon the use of traditional display device stands and battery covers. It contemplates a novel, integral battery cover and stand, or battery cover/stand, which operates both to retain a battery or batteries in a display device and to provide a stand for the display device. Further, the stand can be utilized to provide the display device with three different viewing angles.

The present invention comprises a battery cover/stand fashioned as a somewhat flat piece of plastic or polymeric material having two triangular shaped legs extending outwardly from one flat surface. The battery cover/stand is easily inserted into a slot in the display device where it is snapped into place over a recess in the device where the batteries are positioned. The battery cover/stand may be configured by the user into one of three operating positions:

(1) with the triangular shaped legs extending into the recess thus allowing the display device to sit flat, face up on a desk or to be mounted on a wall;

(2) with the triangular shaped legs extending into the recess, but with an edge of the battery cover/stand extending outwardly from a side of the device, thus allowing the device to be balanced on its side and on the extended edge; and (3) with the triangular shaped legs extending away from the display device providing a stand for the display device to be balanced. Each of the three positions allows the display face to be positioned at a slightly different viewing angle. The battery cover/stand may be easily removed by the viewer for adjustment of the viewing angle or for replacement of the batteries.

A primary object of the present invention is to provide a battery cover/stand for a display device which can be configured in one of three positions so that the display device may be positioned at slightly different viewing angles.

Another object of the present invention is provide a battery cover/stand which may be easily removed and reinserted by a user.

Another object of the present invention is to provide a battery cover/stand for a display device which provides a protective cover for a battery or batteries utilized by the display device.

Another object of the present invention is to provide a visually-pleasing battery cover/stand for a display device for use with wall and desk mountable display devices.

The above and other objectives and advantages of the invention will become more apparent upon reading the description of the invention in connection with the drawings described below.

DESCRIPTION OF THE PREFERRED EMBODIMENT

Figure 1:
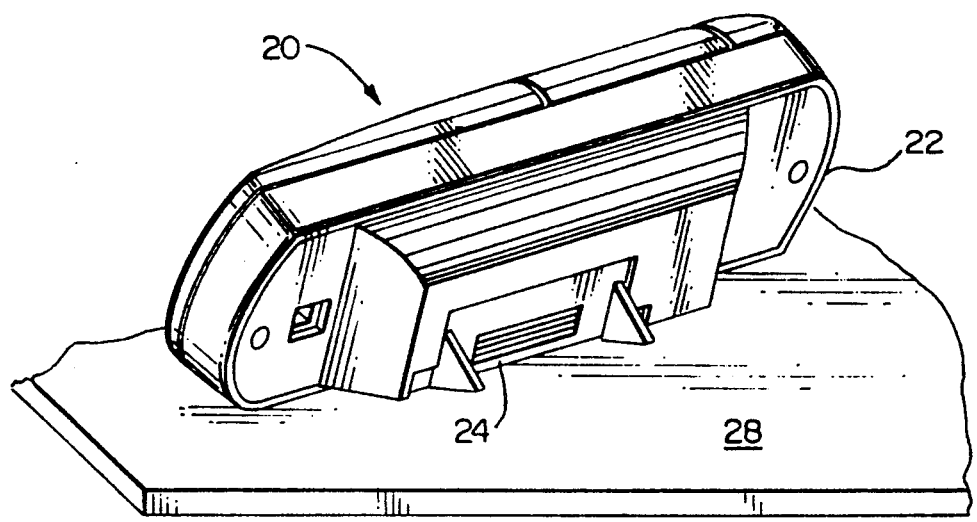
FIG. 1 is a perspective view of the backside of a display device incorporating the battery cover/stand of the present invention.

FIG. 1 illustrates a rear perspective view of a battery-powered display device 20 having a housing 22 and utilizing an integral battery cover/adjustable stand of the present invention (hereinafter "battery cover/stand") 24. Display device 20, which is in this case an incoming call line identification device, "ICLID", is shown positioned on desk top 28 so that the display face (not shown) of display device 20 is directed at a viewing angle of approximately 45 degrees with respect to desk top 28.

Figure 2:
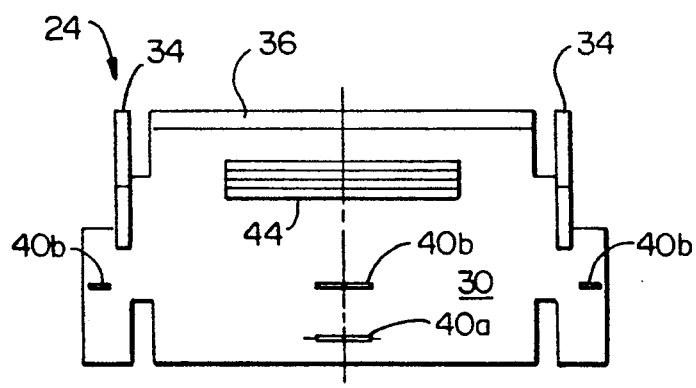
FIG. 2 is a front view of the battery cover/stand of the present invention.
Figure 3:
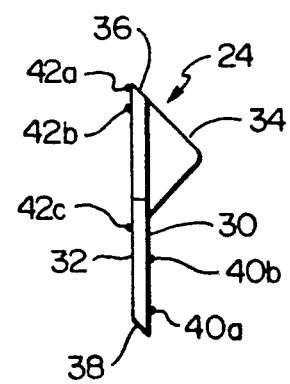
FIG. 3 is a left side view of the battery cover/stand of the present invention.
Figure 4:
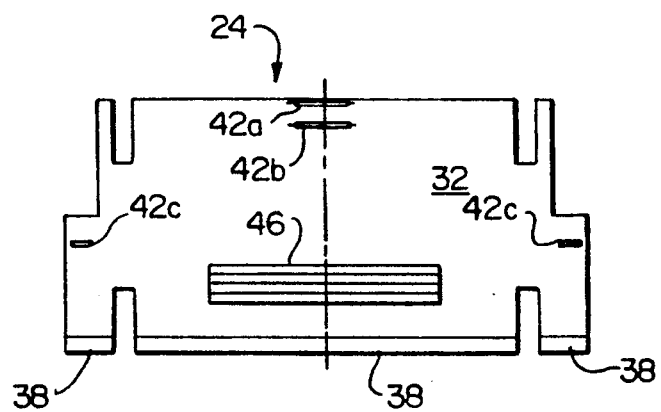
FIG. 4 is a rear view of the battery cover/stand of the present invention.

FIGS. 2 through 4 illustrate front, left and rear views of the battery cover/stand 24 of the present invention. Battery cover/stand 24, which is formed of plastic or polymeric material, is substantially flat, having front and back planar faces 30, 32. Battery cover/stand 24 further comprises two stand legs 34, each having substantially the shape of an isosceles right triangle as can be seen in FIG. 3. Battery cover/stand 24 further comprises top and bottom edges 36, 38 extending between front and back planar faces 30, 32.

As can be seen in FIG. 2, front planar face 30 further comprises a primary retaining rib 40a and three secondary retaining ribs 40b. As shown in FIG. 3, each retaining rib 40a, 40b has a substantially semi-circular cross-section. Similarly, back planar face 32 has a primary retaining rib 42a, a secondary retaining rib 42b, and two tertiary retaining ribs 42c as shown in FIG. 4. The retaining ribs function to retain battery cover/stand 24 in display device 20 in one of three positions.

Front and back planar faces 30, 32 further comprise thumb grips 44, 46 in the form of serrations as can be seen in FIGS. 2 and 4. The thumb grips allow the user to easily grip battery cover/stand 24, usually with the thumb, for removal from device 20 with a sliding action.

Figure 5C:
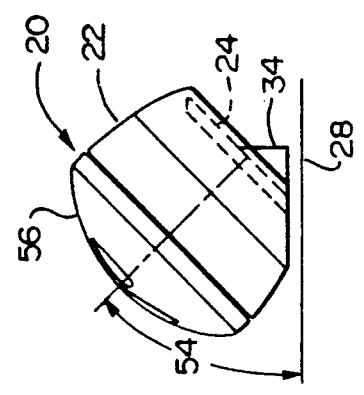
FIG. 5C is a side view of a display device utilizing the battery cover/stand of the present invention, the display device face being directed at a viewing angle of approximately 45 degrees with respect to the desk top surface.
Figure 5B:
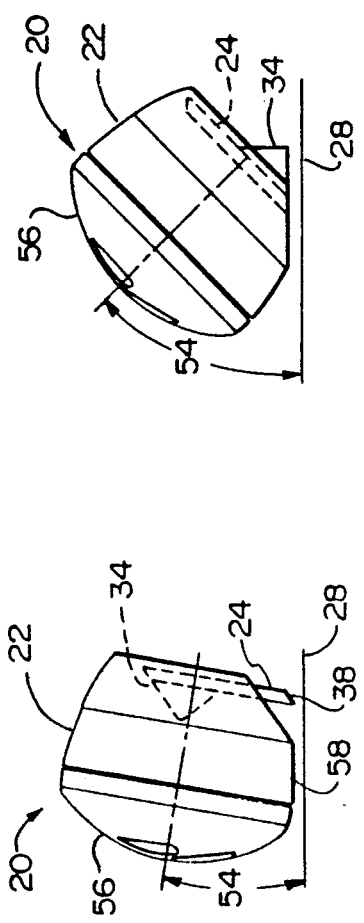
FIG. 5B is a side view of a display device utilizing the battery cover/stand of the present invention, the display device face being directed at a viewing angle of approximately 10 degrees with respect to the desk top surface.
Figure 5A:
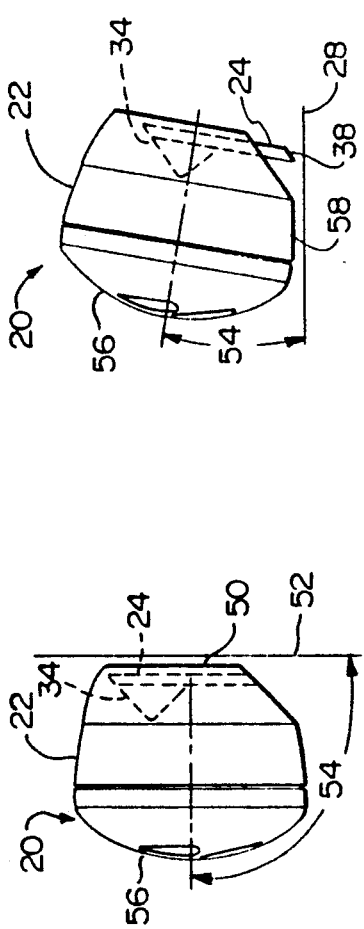
FIG. 5A is a side view of a wall mounted display device utilizing the battery cover/stand of the present invention, the battery cover/stand being shown in dashed lines.

FIGS. 5A, 5B, and 5C illustrate battery cover/stand 24 being retained in each of three operating positions. FIG. 5A shows device 20 being wall mounted, battery cover/stand 24 being configured such that it is completely inserted in device 20. In this configuration, stand legs 34 extend into a recess in housing 22 thereby providing a substantially flat back surface 50 which may lie flush against a wall 52. The viewing angle 54 of display face 56 is approximately 90 degrees with respect to the wall. Alternatively, display device 20 in the same configuration may be situated face up on a desk. The corresponding viewing angle would be, similarly, approximately 90 degrees with respect to the desk top surface.

FIG. 5B shows device 20 being desk mounted with battery cover/stand 24 being configured such that stand legs 34, again, extend into housing 22. In this configuration, however, battery cover/stand 24 is not completely inserted into device 20 so that bottom edge 38 of battery cover/stand 24 extends outwardly therefrom. Thus, device 20 may be balanced on one of its sides 58 and bottom edge 38 of the battery cover/stand 24. The viewing angle 54 of the display face 56 is approximately 10 degrees with respect to the desk top surface 28.

FIG. 5C illustrates display device 20 utilizing the battery cover/stand 24 configured so that stand legs 34 extend outwardly from the device 20. Stand legs 34 provide a stand so that device 20 may be balanced on a desk such that the viewing angle 54 of the display face 56 is approximately 45 degrees with respect to the desk top surface 28.

Figure 6:
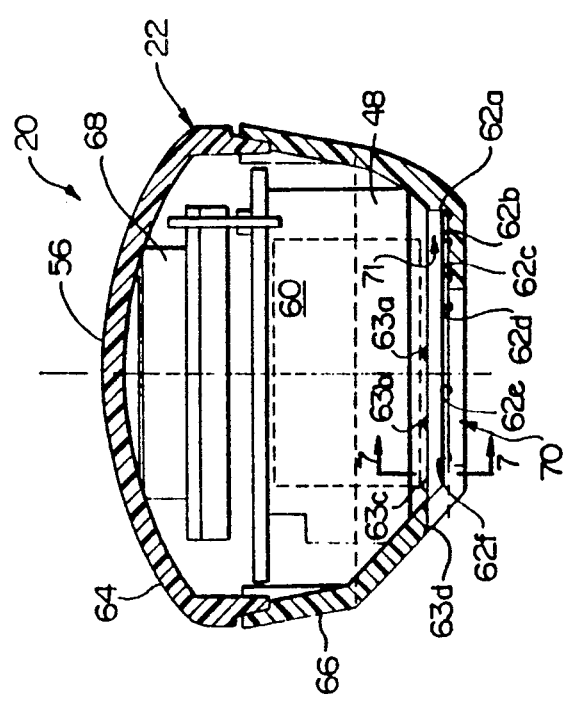
FIG. 6 is a vertical section of the display device without the battery cover/stand.

FIG. 6 is a vertical section of display device 20 without battery cover/stand 24. Display device 20 comprises a housing 22 having a top and a bottom portion 64, 66 cooperatively connected. Within housing 22, display device 20 comprises electronic components 68 and a battery recess 48. A battery 60, shown in dashed lines, may be connected therein. Bottom portion 66 of housing 22 comprises an opening 70 through which battery 60 may be inserted. Bottom portion 66 further comprises a battery cover/stand retaining slot 71 for securing battery cover/stand 24 in device 20. In operation, battery cover/stand 24 is inserted in battery cover/stand retaining slots 71 for securing battery 60 in device 20 and for providing an adjustable stand for device 20.

Bottom portion 66 further comprises lower retaining grooves 62a, 62b, 62c, 62d, 62e, and 62f and upper retaining grooves 63a, 63b, 63c and 63d. The retaining grooves have a semi-circular cross-sectional shape dimensioned for engaging corresponding retaining ribs and are utilized to retain battery cover/stand 24 in position. This will be described in greater detail below.

Figure 7:
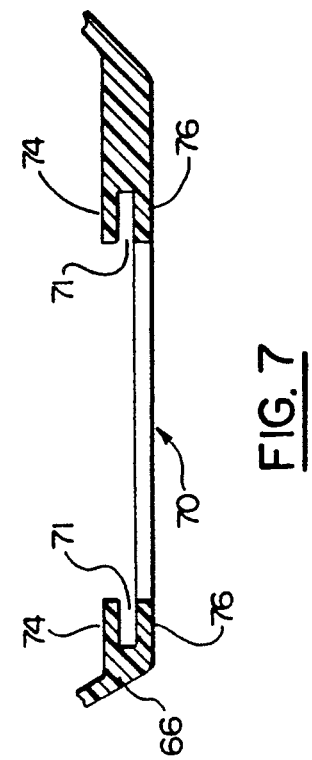
FIG. 7 is a cross-sectional view of the display device as indicated by arrows 7—7 in FIG. 6.

FIG. 7 illustrates bottom portion 66 in partial cross-section as indicated by arrows 7—7 in FIG. 6. Opening 70 is dimensioned so that a battery may be inserted therethrough into the device. Bottom portion 66 further comprises an inner and an outer ledge 74, 76 forming battery cover/stand retaining slots 71. Inner ledge 74 flanks opening 70 on two sides while outer ledge 76 borders opening 70 on three sides. Inner and outer ledges 74, 76, which act to retain battery cover/stand 24 in housing 22, have retaining grooves for cooperating with the retaining ribs of battery cover/stand 24.

Figure 8A:
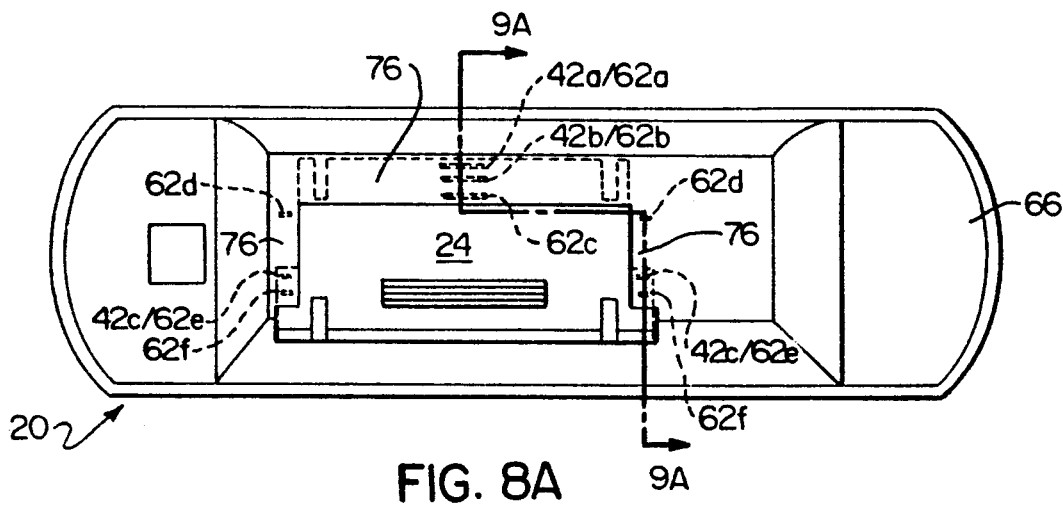
FIG. 8A is a bottom view of the display device utilizing the battery cover/stand of the present invention showing the device configured according to FIG. 5A.
Figure 9C:
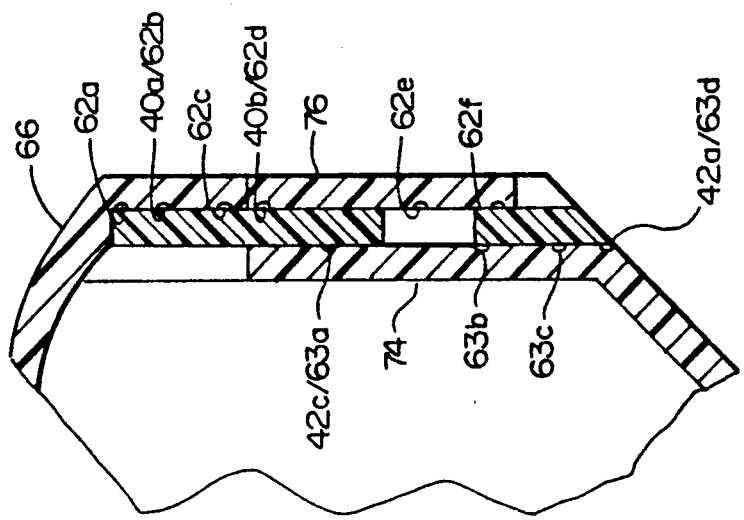
FIG. 9C is an enlarged vertical section taken along arrows 9C—9C of FIG. 8C.

FIG. 8A illustrates a bottom view of device 20 with battery cover/stand 24 completely inserted in retaining slots 71. This corresponds to the operating position shown in FIG. 5A. As can be seen, outer ledge 76 surrounds opening 70 on three sides and has retaining grooves 62a, 62b, 62c, 62d, 62e, and 62f. In this operating position, retaining rib 42a engages groove 62a as is clearly shown in FIG. 9A. Similarly, ribs 42b and 42c cooperate with grooves 62b and 62e, respectively, for retaining battery cover/stand 24 in slots 71. Rib 40b shown in FIG. 9A engages inner retaining groove 63b while rib 40a juxtaposes an inner edge (not shown) of bottom portion 66 for preventing any outward movement of battery cover/stand 24 from slots 71. In this operating position, outer grooves 62c, 62d, and 62f and inner grooves 63a, 63c and 63d are not utilized.

Figure 8B:
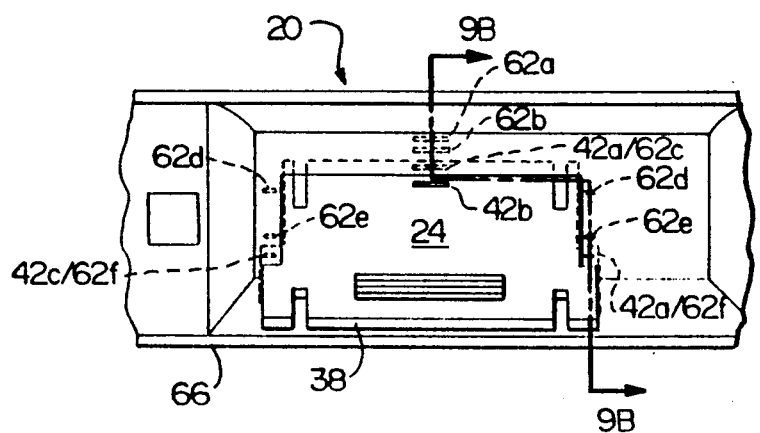
FIG. 8B is a bottom view of the display device utilizing the battery cover/stand as configured in FIG. 5B.
Figure 9B:
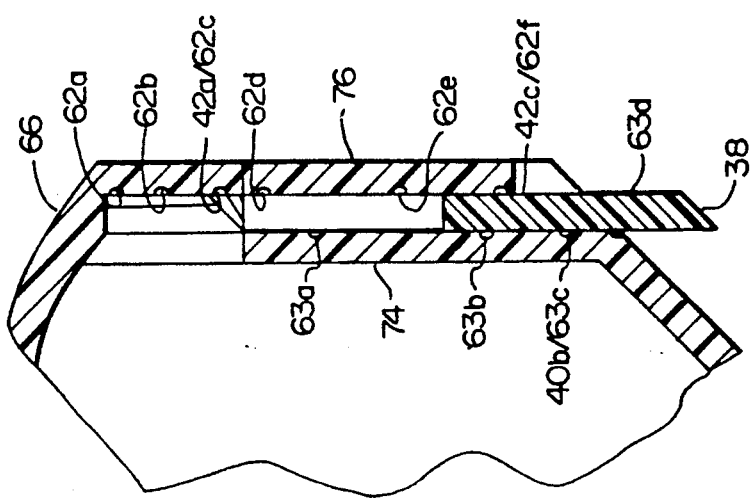
FIG. 9B is an enlarged vertical section taken along arrows 9B—9B of FIG. 8B.
Figure 9A:
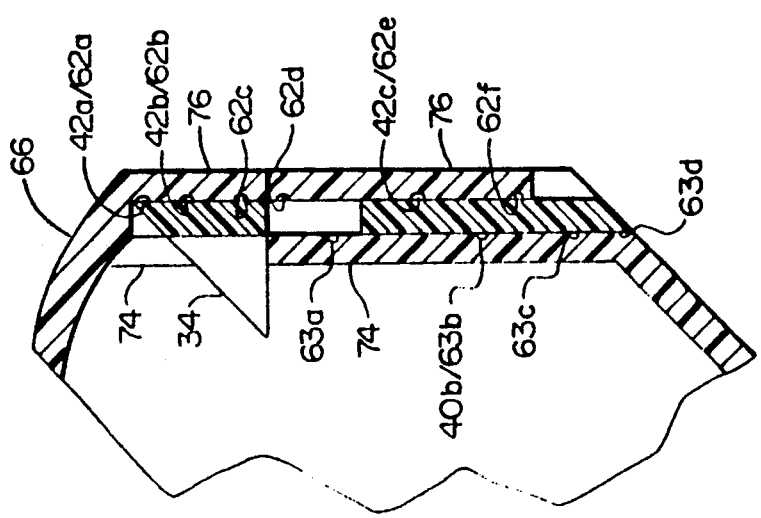
FIG. 9A is an enlarged vertical section taken along arrows 9A—9A of FIG. 8A.

FIG. 8B shows a bottom view of a portion of device 2 with battery cover/stand 24 configured in retaining slots 71 corresponding to FIG. 5B. FIG. 9B depicts a vertical section as indicated by arrows 9B—9B in FIG. 8B. In this operating position, battery cover/stand 24 is configured so that edge 38 extends outwardly from slots 71 so that it may be used as a balance for device 20 having a viewing angle of about 10 degrees as shown in FIG. 5B. Retaining ribs 40b, 42a and 42c engage grooves 63c, 62c and 62f, respectively, as shown in FIG. 9B, and center rib 40b juxtaposes inner edge (not shown) for securing battery cover/stand 24 in slots 71. Ribs 40a, 42b and grooves 62a, 62b, 62d, 62e, 63a, 63b, and 63d and are not utilized in this configuration.

Figure 8C:
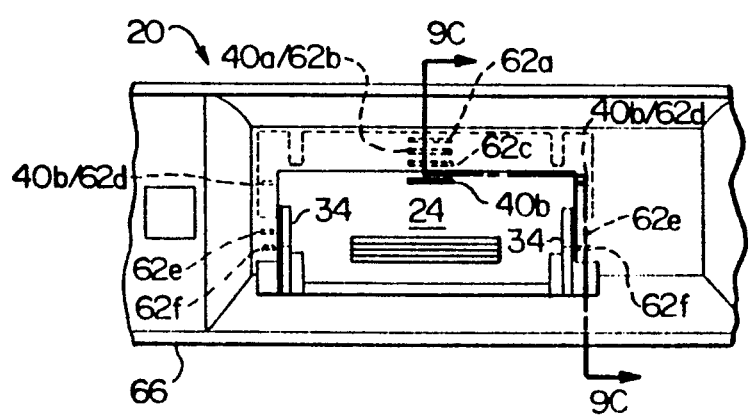
FIG. 8C is a bottom view of the display device utilizing the battery cover/stand as configured in FIG. 5C.

FIG. 8C shows a bottom view of a portion of device 20 configured according to FIG. 5C. Similarly, FIG. 9C depicts a vertical section as indicated by arrows 9C—9C in FIG. 8C. In this operating position, battery cover/stand 24 is configured so that legs 34 extend outwardly from device 20 so that device 20 may be balanced on a desk with a viewing angle 54 of 45 degrees as in FIG. 5C. Retaining rib 40a, two outer ribs 40b, and rib 42c engage grooves 62b, 62d and 63a, respectively. Rib 42a engages groove 63d as shown in FIG. 9C and rib 42b cooperates with inner ledge (not shown) for securing battery cover/stand 24 in slots 71. Center rib 40b and grooves 62a, 62c, 62e, 62f, 63b and 63c are not utilized in this configuration.

To remove the battery cover/stand 24 from device 20, the user simply applies pressure with the thumb to thumb grip 44 (46) to disengage the ribs from the grooves and slides the battery/cover stand out of the slots. For insertion, the battery/cover stand is inserted into the slots until it snaps into the desired configuration.

Thus, it can be seen from the foregoing specification and attached drawings that the battery cover/stand of the present invention provides an effective means for securing a battery in a wall or desk mounted display device while simultaneously being utilized as a stand which can be adjusted into one of three operating positions.

What is claimed is:

1. A display device which utilizes a battery for power comprising:
   a housing having a display face, a battery recess dimensioned to receive a battery in said housing, and a battery cover/stand receiving slot; and
   a battery cover/stand for providing both a cover for a battery and an adjustable stand for said device, said battery cover/stand comprising:
   a cover portion, having first and second planar surfaces, for covering and securing a battery in said display device;
   a stand portion integral with and protruding from said first planar surface of said cover portion; and
   means integral with said cover portion selectively securing said battery cover/stand to said display device in said retaining slot in one of a plurality of positions.

2. A display device as described in claim 1, wherein said securing means may selectively secure said battery cover/stand to said display device in a desk mounted position for positioning said display device on a desk top surface, said stand portion being recessed in said display device in said desk mounted position.

3. A display device as described in claim 2, wherein said display face is positioned in said desk mounted position such that it has a viewing angle of approximately 90 degrees with respect to a desk top surface.

4. A display device as described in claim 1, wherein said securing means may selectively secure said battery cover/stand to said display device in a desk mounted position for positioning said display device on a desk top surface, said stand portion extending outwardly from said display device in said desk mounted position.

5. A display device as described in claim 4, wherein said display face is positioned in said desk mounted position such that it has a viewing angle of approximately 45 degrees with respect to a desk top surface.

6. A display device as described in claim 1, wherein said securing means may selectively secure said battery cover/stand to said display device in a desk mounted position for positioning said display device on a desk top surface, said stand portion being recessed in said display device and said cover portion further comprising first and second edges, said first edge protruding from said display device in said desk mounted position.

7. A display device as described in claim 6, wherein said display face is positioned in said desk mounted position such that it has a viewing angle of approximately 10 degrees with respect to a desk top surface.

8. A display device as described in claim 1, wherein said cover portion further comprises gripping means for a user to grip said battery cover/stand.

9. A display device as described in claim 8, wherein said gripping means comprises a thumb grip comprising a plurality of serrations.

10. A display device as described in claim 1, wherein said display device comprises at least one retaining groove adjacent to said retaining slot and said selective securing means comprises at least two projecting retaining ribs for engaging said retaining groove, a first projecting retaining rib being positioned on said first planar surface and a second projecting retaining rib being positioned on said second planar surface, whereby said battery cover/stand may be selectively secured in said slot in a first position or a second position.

11. A display device as described in claim 1, wherein said securing means comprises a plurality of projecting retaining ribs disposed on said first planar surface and a plurality of projecting retaining ribs disposed on said second planar surface, said display device comprising a plurality of grooves adjacent to said retaining slot and positioned so that said projecting retaining ribs may be selectively engaged with said grooves.

* * * * *